(12) United States Patent
Ota et al.

(10) Patent No.: US 11,991,931 B2
(45) Date of Patent: May 21, 2024

(54) MAGNETIC RECORDING LAYER, MAGNETIC DOMAIN WALL MOVING ELEMENT AND MAGNETIC RECORDING ARRAY (71) Applicant: TDK CORPORATION, Tokyo (JP)

(72) Inventors: Minoru Ota, Tokyo (JP); Tatsuo Shibata, Tokyo (JP)

(73) Assignee: TDK CORPORATION, Tokyo (JP)

(*) Notice: Subject to any disclaimer, the term of this patent is extended or adjusted under 35 U.S.C. 154(b) by 704 days.

(21) Appl. No.: 17/124,643

(22) Filed: Dec. 17, 2020

(65) Prior Publication Data

US 2021/0104662 A1 Apr. 8, 2021

Related U.S. Application Data (63) Continuation-in-part of application No. PCT/JP2019/039106, filed on Oct. 3, 2019.

(51) Int. Cl.
*H10N 50/80* (2023.01)
*G11C 11/16* (2006.01)
*H10B 61/00* (2023.01)
*H10N 50/01* (2023.01)
*H10N 50/10* (2023.01)
*H10N 50/85* (2023.01)

(52) U.S. Cl.
CPC .......... *H10N 50/80* (2023.02); *G11C 11/161* (2013.01); *H10B 61/22* (2023.02); *H10N 50/10* (2023.02); *H10N 50/85* (2023.02)

(58) Field of Classification Search
CPC ........ H10N 50/80; H10N 50/10; H10N 50/85; G11C 11/161; H10B 61/22
See application file for complete search history.

(56) References Cited

U.S. PATENT DOCUMENTS

| 6,876,522 | B2 | 4/2005 | Ambrose et al. |
| 10,777,247 | B1* | 9/2020 | Sun ...................... G11C 11/161 |
| 11,362,269 | B2 | 6/2022 | Cai et al. |
| 2002/0159203 | A1 | 10/2002 | Saito et al. |
| 2007/0217087 | A1 | 9/2007 | Hirata et al. |
| 2010/0149863 | A1 | 6/2010 | Lee et al. |
| 2011/0129691 | A1* | 6/2011 | Ishiwata ............. G11C 11/5607 428/827 |
| 2011/0207240 | A1* | 8/2011 | Lim ....................... G11C 11/14 257/E21.665 |
| 2013/0313506 | A1 | 11/2013 | Murayama et al. |
| 2015/0078070 | A1 | 3/2015 | Quinsat et al. |
| 2017/0221577 | A1 | 8/2017 | Choe |

(Continued)

FOREIGN PATENT DOCUMENTS

| JP | 2005085286 A | * | 3/2005 |
| JP | 2007-250977 A | | 9/2007 |

(Continued)

OTHER PUBLICATIONS

Nov. 15, 2022 Office Action issued in U.S. Appl. No. 17/141,347.

(Continued)

*Primary Examiner* — David Vu
*Assistant Examiner* — Brandon C Fox
(74) *Attorney, Agent, or Firm* — Oliff PLC (57) ABSTRACT A magnetic recording layer according to this embodiment has a magnetic domain wall inside and contains a rare gas element.

15 Claims, 5 Drawing Sheets

(56) References Cited

U.S. PATENT DOCUMENTS

| | | | |
|---|---|---|---|
| 2018/0277683 A1* | 9/2018 | Han | H01L 29/40111 |
| 2018/0301621 A1 | 10/2018 | Sato et al. | |
| 2019/0019942 A1 | 1/2019 | Nakada et al. | |
| 2019/0074430 A1 | 3/2019 | Shiokawa et al. | |
| 2019/0088395 A1 | 3/2019 | Ota et al. | |
| 2019/0189172 A1 | 6/2019 | Higo et al. | |
| 2019/0355898 A1 | 11/2019 | Nakada | |

FOREIGN PATENT DOCUMENTS

| | | | |
|---|---|---|---|
| JP | 2007-324269 A | 12/2007 | |
| JP | 2010-141340 A | 6/2010 | |
| JP | 2012-190914 A | 10/2012 | |
| JP | 2013-247198 A | 12/2013 | |
| JP | 5441005 B2 | 3/2014 | |
| JP | 2015-060609 A | 3/2015 | |
| JP | 2017-097935 A | 6/2017 | |
| JP | 6204769 B2 | 9/2017 | |
| JP | 2019-021751 A | 2/2019 | |
| JP | 2019-046976 A | 3/2019 | |
| JP | 2019-047120 A | 3/2019 | |
| JP | 2019-201095 A | 11/2019 | |
| WO | 2017/208653 A1 | 12/2017 | |

OTHER PUBLICATIONS

Guchang Han et al. "Control of Offset Field and Pinning Stability in Perpendicular Magnetic Tunnelling Junctions With Synthetic Antiferromagnetic Coupling Multilayer". Journal of Applied Physics, vol. 117, 2015, pp. 17B515-1 through 17B515-4.

Goripati, Hari S. et al. "Bi-Quadratic Interlayer Exchange Coupling in CO2MNSI/AG/CO2MNSI Pseudo Spin-Valve". Journal of Applied Physics, 2011, 110, 123914, pp. 1-7.

Furubayashi, T. et al. "Structure and Transport Properties of Current-Perpendicular-To-Plane Spin Valves Using CO2FEAL0.5SI0.5 and CO2MNSI Heusler Alloy Electrodes". Journal of Applied Physics, 107, 113917 2010, pp. 1-7.

Kasai, S. et al. "Large Magnetoresistance in Heusler-Alloy-Based Epitaxial Magnetic Junctions With Semiconducting CU(IN0.8GA0.2)SE2 Spacer". Applied Physics Letters, 109, 032409 (2016), pp. 1-4.

Wen, Zhenchao et al. "Fully Epitaxial C1B-TYPE NIMNSB Half-Heusler Alloy Films for Current-Perpendicular-to-Plane Giant Magnetoresistance Devices With a AG Spacer". Scientific Reports, 5:18387, DOI: 10.1038/srep18387, 2015, pp. 1-10.

Galanakis, I et al. "Electronic Structure and Slater-Pauling Behaviour in Half-Metallic Heusler Alloys Calculated From First Principles". Journal of Physics D: Applied Physics, 39 (2006), pp. 765-775.

Kwon, B. et al. "Anisotropic Magnetoresistance and Current-Perpendicular-to-Plane Giant Magnetoresistance in Epitaxial NIMNSB-Based Multilayers". Journal of Applied Physics, 119, 023902 (2016), pp. 1-6.

Choi, Young-suk et al. "Enhancement of Current-Perpendicular-to-Plane Giant Magnetoresistance By Insertion of Amorphous Ferromagnetic Underlayer in Heusler Alloy-Based Spin-Valve Structures". Applied Physics Express, 10, 013006 (2017), pp. 1-4.

Mar. 16, 2021 International Search Report issued in International Patent Application No. PCT/JP2020/047677.

Nov. 9, 2023 Office Action issued in U.S. Appl. No. 18/019,919.

* cited by examiner

MAGNETIC RECORDING LAYER, MAGNETIC DOMAIN WALL MOVING ELEMENT AND MAGNETIC RECORDING ARRAY

TECHNICAL FIELD

The present invention relates to a magnetic recording layer, a magnetic domain wall moving element, and a magnetic recording array.

BACKGROUND ART

A next-generation non-volatile memory to replace flash memories or the like in which miniaturization is approaching its limit is receiving attention. For example, a magnetoresistive random access memory (MRAM), a resistance random access memory (ReRAM), a phase change random access memory (PCRAM), and the like are known as next-generation non-volatile memories.

An MRAM uses a change in resistance value caused by a change in a direction of magnetization for data recording. The data recording is carried out by each of the magnetoresistance change changing elements constituting the MRAM. For example, Patent Document 1 discloses a magnetoresistance change changing element (a magnetic domain wall moving element) capable of recording multi-valued data by moving a magnetic domain wall in a magnetic recording layer. Patent Document 1 discloses that the multi-valued data recording is stabilized by providing a trap site in the magnetic recording layer.

CITATION LIST

Patent Literature

[Patent Document 4]
Japanese Patent No. 5441005

SUMMARY OF INVENTION

Technical Problem

The magnetic domain wall moving element described in Patent Document 1 has irregularities on side surfaces of the magnetic recording layer. The irregularities function as trap sites of the magnetic domain wall and control the position of the magnetic domain wall. However, when the size of the magnetic domain wall moving element decreases, it is difficult to properly form the irregularities. Patent Document 1 also discloses that grain boundaries are used as the trap sites of the magnetic domain wall. The number of trap sites in the magnetic domain wall moving element matches the number of gradations of the magnetic domain wall moving element. Since the grain boundaries are as large as the size of one trap site, as the magnetic domain wall moving element becomes finer, it is difficult to obtain a magnetic domain wall moving element having a desired number of gradations.

The present invention has been made in view of the aforementioned problems, and an object of the present invention is to provide a magnetic recording layer, a magnetic domain wall moving element and a magnetic recording array in which the operation of the magnetic domain wall can be easily controlled.

Solution to Problem (1) A magnetic recording layer according to a first aspect has a magnetic domain wall inside and contains a rare gas element.

(2) In the magnetic recording layer according to the aforementioned aspect, a central region of the magnetic recording layer may have a higher concentration of the rare gas element than an outer peripheral region of the magnetic recording layer, on a cut surface intersecting a first direction in which the magnetic recording layer extends.

(3) In the magnetic recording layer according to the aforementioned aspect, a central region of the magnetic recording layer may have a lower concentration of the rare gas element than an outer peripheral region of the magnetic recording layer, on a cut surface intersecting a first direction in which the magnetic recording layer extends.

(4) In the magnetic recording layer according to the aforementioned aspect, an average rare gas concentration may be 25 atm % or less.

(5) In the magnetic recording layer according to the aforementioned aspect, an average rare gas concentration may be 0.14 atm % or more.

(6) The magnetic recording layer according to the aforementioned aspect may include a first lattice containing the rare gas element in a crystal lattice, and a second lattice containing no rare gas element in the crystal lattice, the first lattice being dispersed inside.

(7) A magnetic domain wall moving element according to a second aspect includes the magnetic recording layer according to the aforementioned aspect, a first magnetization fixed portion which is configured to fix a magnetization of a first region of the magnetic recording layer, and a second magnetization fixed portion which is configured to fix a magnetization of a second region sandwiching the magnetic domain wall of the magnetic recording layer with the first region.

(8) In the magnetic domain wall moving element according to the aforementioned aspect, at least one of the first magnetization fixed portion and the second magnetization fixed portion may be a conductive layer connected to the magnetic recording layer and containing a ferromagnetic material.

(9) In the magnetic domain wall moving element according to the aforementioned aspect, the conductive layer may have a rare gas element, and a rare gas element concentration of the magnetic recording layer may be higher than a rare gas element concentration of the conductive layer.

(10) The magnetic domain wall moving element according to the aforementioned aspect may further include a non-magnetic layer and a ferromagnetic layer laminated on the magnetic recording layer, the non-magnetic layer being located between the ferromagnetic layer and the magnetic recording layer.

(11) In the magnetic domain wall moving element according to the aforementioned aspect, the ferromagnetic layer may have a rare gas element, and a rare gas element concentration of the magnetic recording layer may be higher than a rare gas element concentration of the ferromagnetic layer.

(12) A magnetic recording array according to a third aspect has a plurality of magnetic domain wall moving elements according to the aforementioned aspect.

Advantageous Effects of Invention

In the magnetic recording layer, the magnetic domain wall moving element, and the magnetic recording array according to the aforementioned aspect, the operation of the magnetic domain wall is easily controlled.

DESCRIPTION OF EMBODIMENTS

Hereinafter, the present embodiment will be described in detail with reference to the drawings as appropriate. The drawings used in the following description may be enlarged for convenience to make the features of the present invention easy to understand, and the dimensional ratios of the respective components may differ from the actual ones. The materials, dimensions, and the like described in the following description are examples, and the present invention is not limited thereto and can be appropriately modified and carried out within the range in which the effects of the present invention are exhibited.

First, directions will be defined. An x direction and a y direction are directions substantially parallel to one surface of a substrate Sub (see FIG. 2) to be described below. The x direction is a direction in which a magnetic recording layer 10 to be described below extends, and is a direction from a first conductive layer 30 to a second conductive layer 40 to be described below. The x direction is an example of a first direction. The y direction is a direction orthogonal to the x direction. A z direction is a direction from the substrate Sub to be described below toward a magnetic domain wall moving element 100, for example, a stacking direction of the magnetic recording layer 10. Further, in the present specification, the expression "extending in the x direction" means that, for example, the dimension in the x direction is larger than a minimum dimension among the dimensions in the x direction, the y direction, and the z direction. The same also applies to a case of extending in other directions.

First Embodiment

Figure 1:
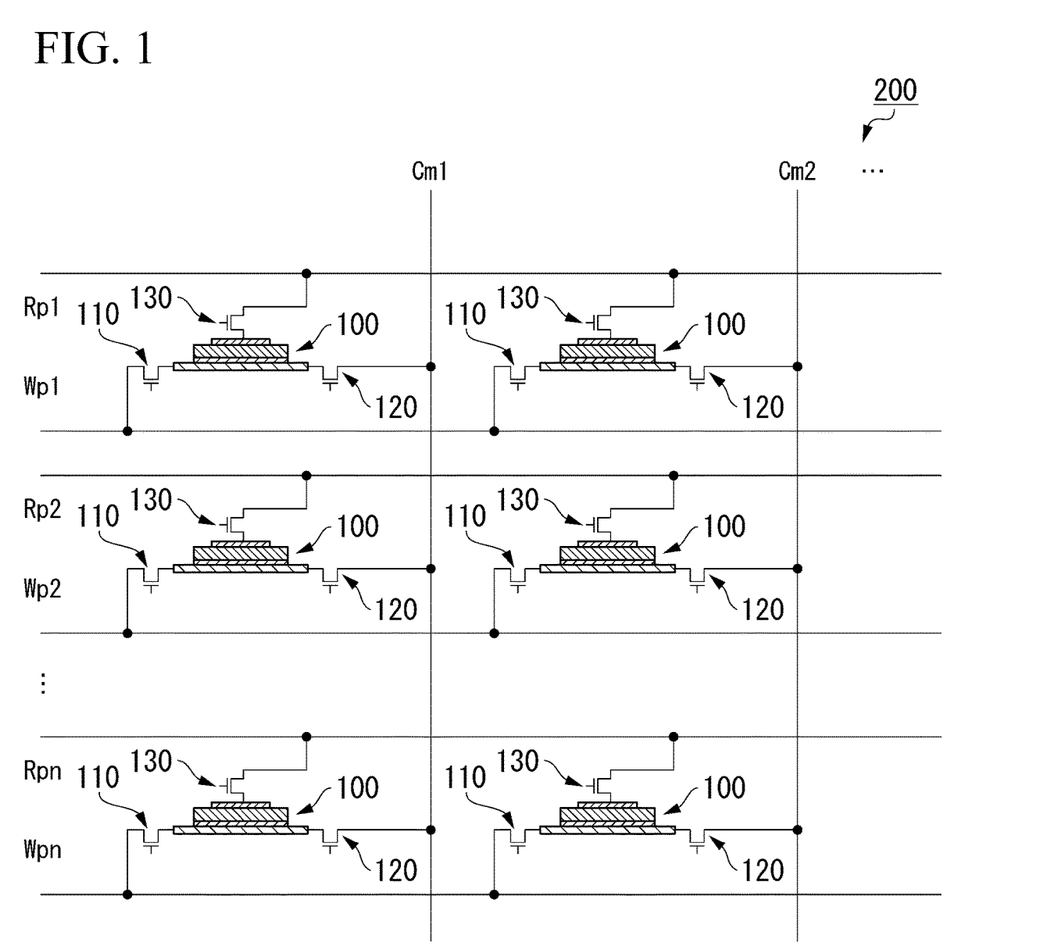
FIG. 1 is a configuration diagram of a magnetic recording array according to a first embodiment.

FIG. 1 is a configuration diagram of a magnetic recording array according to the first embodiment. The magnetic recording array 200 is equipped with a plurality of magnetic domain wall moving elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130. The magnetic recording array 200 can be used, for example, in a magnetic memory, a product-sum calculator, and a neuromorphic device.

<First Wiring, Second Wiring, and Third Wiring>

The first wirings Wp1 to Wpn are write wirings. The first wirings Wp1 to Wpn electrically connect a power supply and one or more of the magnetic domain wall moving elements 100 respectively. The power supply is connected to one end portion of the magnetic recording array 200 during use.

The second wirings Cm1 to Cmn are common wirings. The common wirings are wirings that can be used both when writing data and when reading data. The second wirings Cm1 to Cmn electrically connect a reference potential and one or more of the magnetic domain wall moving elements 100 respectively. The reference potential is, for example, a ground. The second wirings Cm1 to Cmn may be provided in each of the plurality of magnetic domain wall moving elements 100, or may be provided over the plurality of magnetic domain wall moving elements 100.

The third wirings Rp1 to Rpn are read wirings. The third wirings Rp1 to Rpn electrically connect the power supply and one or more of the magnetic domain wall moving elements 100 respectively. The power supply is connected to one end portion of the magnetic recording array 200 during use.

<First Switching Element, Second Switching Element, and Third Switching Element>

The first switching element 110, the second switching element 120, and the third switching element 130 shown in FIG. 1 are connected to each of the plurality of magnetic domain wall moving elements 100. A device in which a switching element is connected to the magnetic domain wall moving element 100 is called a semiconductor device. The first switching element 110 is connected between each of the magnetic domain wall moving elements 100 and the first wirings Wp1 to Wpn. The second switching element 120 is connected between each of the magnetic domain wall moving elements 100 and the second wirings Cm1 to Cmn. The third switching element 130 is connected between each of the magnetic domain wall moving elements 100 and the third wirings Rp1 to Rpn.

When the first switching element 110 and the second switching element 120 are turned on, a writing current flows between the first wiring Wp1 to Wpn and the second wiring Cm1 to Cmn connected to the predetermined magnetic domain wall moving element 100. When the first switching element 110 and the third switching element 130 are turned on, a read current flows between the second wiring Cm1 to Cmn and the third wiring Rp1 to Rpn connected to the predetermined magnetic domain wall moving element 100.

The first switching element 110, the second switching element 120, and the third switching element 130 are elements that control the flow of current. The first switching element 110, the second switching element 120, and the third switching element 130 are, for example, a transistor, an element such as an ovonic threshold switch (OTS) that utilizes a phase change of a crystal layer, an element such as a metal-insulator transition (MIT) switch that utilizes changes in band structure, an element such as a Zener diode or an avalanche diode that utilizes a breakdown voltage, and an element whose conductivity changes with a change in atomic position.

Any one of the first switching element 110, the second switching element 120, and the third switching element 130 may be shared by the magnetic domain wall moving elements 100 connected to the same wiring. For example, when the first switching element 110 is shared, one first switching element 110 is provided upstream of the first wirings Wp1 to Wpn. For example, when the second switching element 120 is shared, one second switching element 120 is provided upstream of the second wirings Cm1 to Cmn. For example, when the third switching element 130 is shared, one third switching element 130 is provided upstream of the third wirings Rp1 to Rpn.

Figure 2:
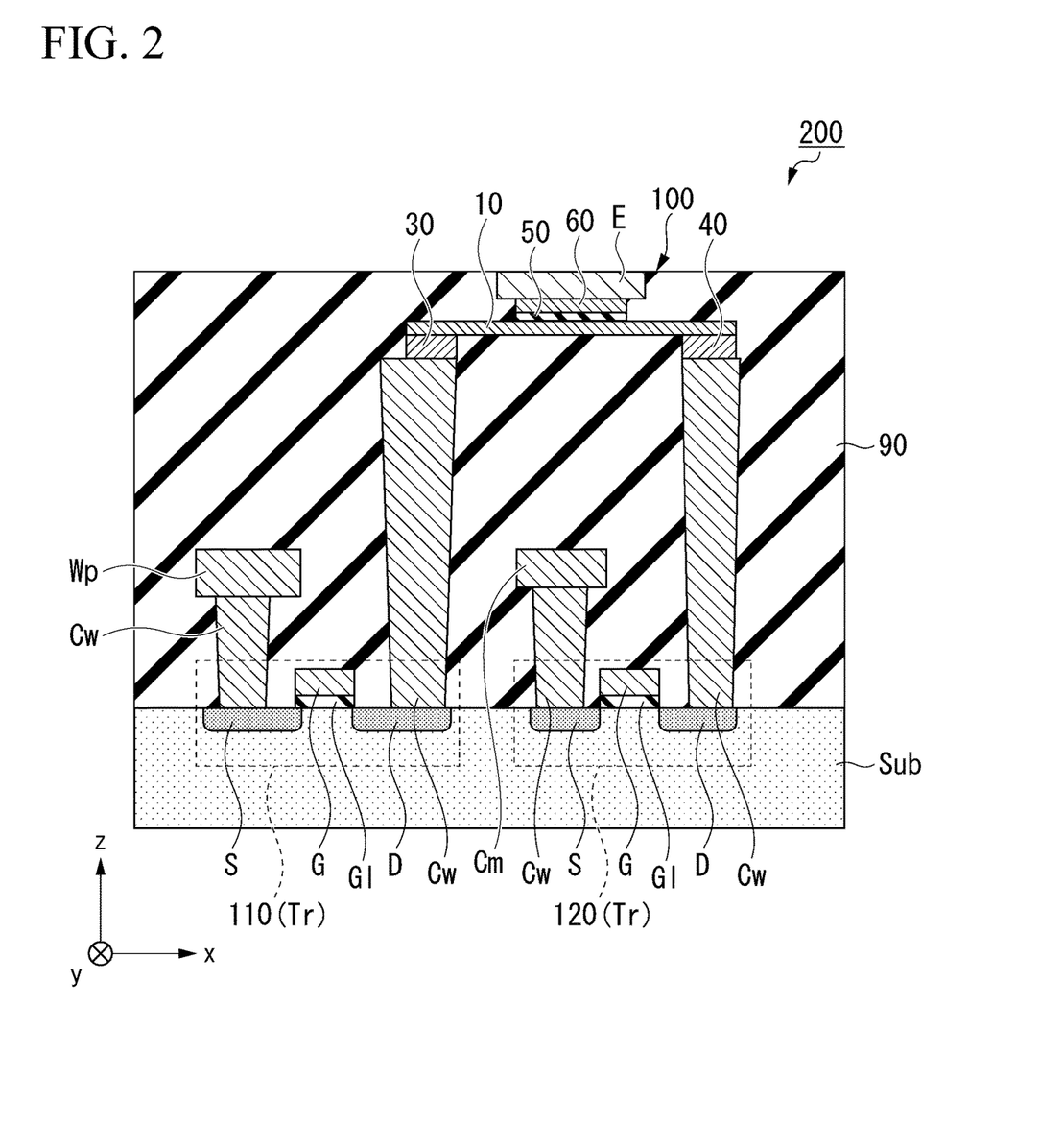
FIG. 2 is a cross-sectional view of a characteristic part of the magnetic recording array according to the first embodiment.

FIG. 2 is a cross-sectional view of a characteristic part of the magnetic recording array 200 according to the first embodiment. FIG. 2 is a cross section of one magnetic domain wall moving element 100 of FIG. 1 along an x-z plane passing through the center of the width of the magnetic recording layer 10 in the y direction.

The first switching element 110 and the second switching element 120 shown in FIG. 2 are transistors Tr. The transistor Tr has a gate electrode G, a gate insulating film GI, and a source region S and a drain region D formed on the substrate Sub. The substrate Sub is, for example, a semiconductor substrate. The third switching element 130 is electrically connected to an electrode E and is located, for example, in the y direction.

Each of the transistors Tr and the magnetic domain wall moving element 100 are electrically connected to each other via a connection wiring Cw. The connection wiring Cw contains a material having conductivity. The connection wiring Cw extends, for example, in the z direction. The connection wiring Cw is, for example, a via wiring formed in an opening of an insulating layer 90.

The magnetic domain wall moving element 100 and the transistor Tr are electrically separated by the insulating layer 90 except for the connection wiring Cw. The insulating layer 90 is an insulating layer that insulates between the wirings of the multilayer wiring or between the elements. The insulating layer 90 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide (ZrOx), or the like.

'Magnetic Domain Wall Moving Element'

Figure 3:
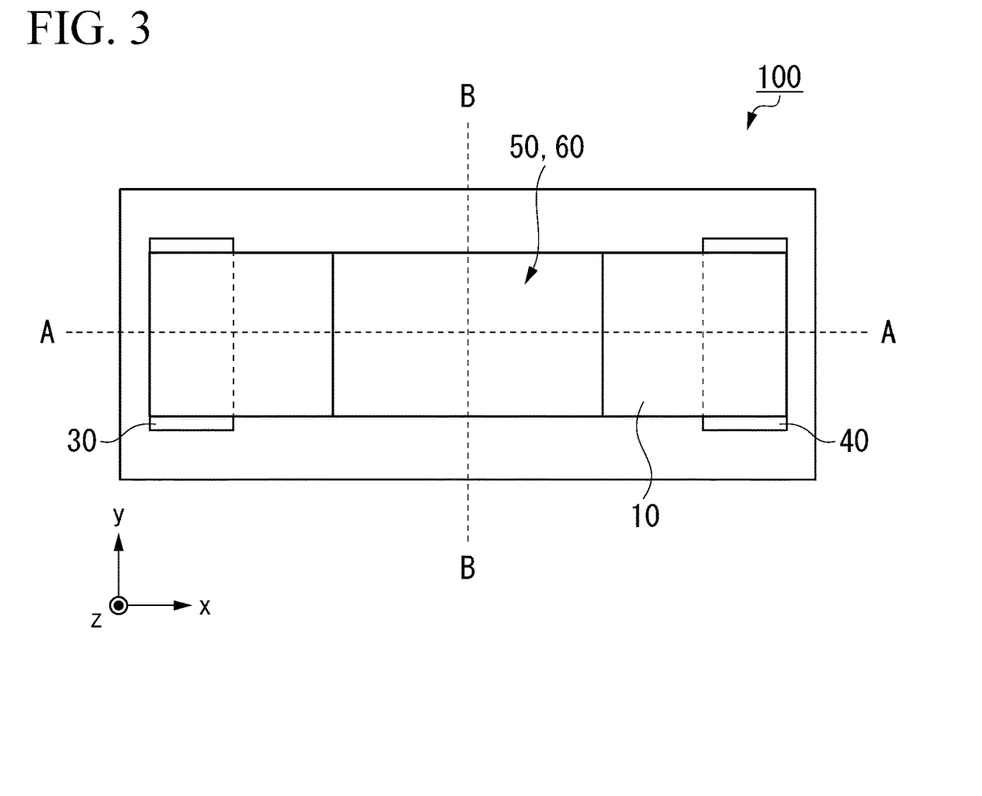
FIG. 3 is a plan view of a magnetic domain wall moving element according to the first embodiment.
Figure 4:
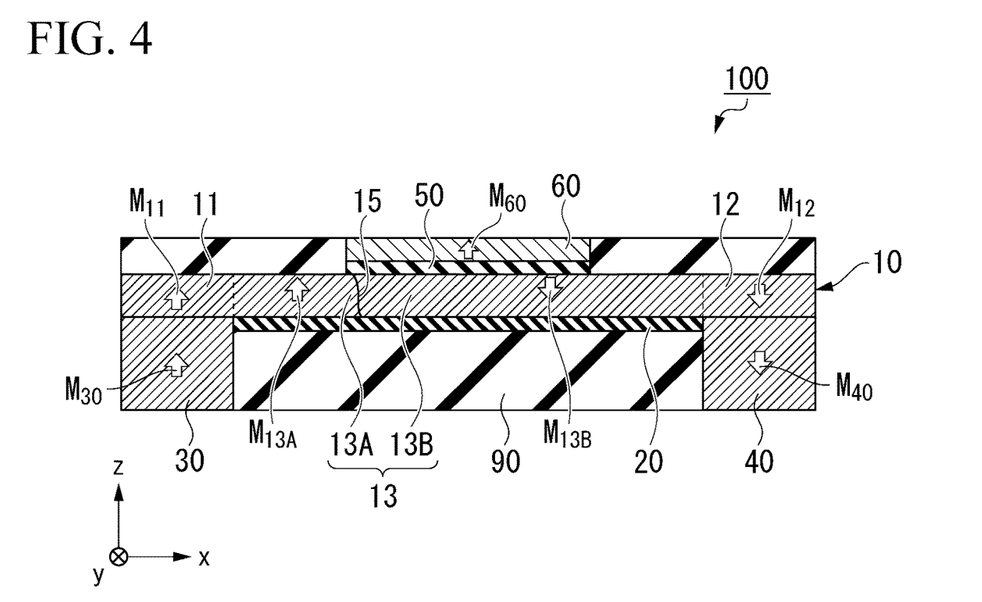
FIG. 4 is a cross-sectional view of the magnetic domain wall moving element according to the first embodiment along a line A-A.
Figure 5:
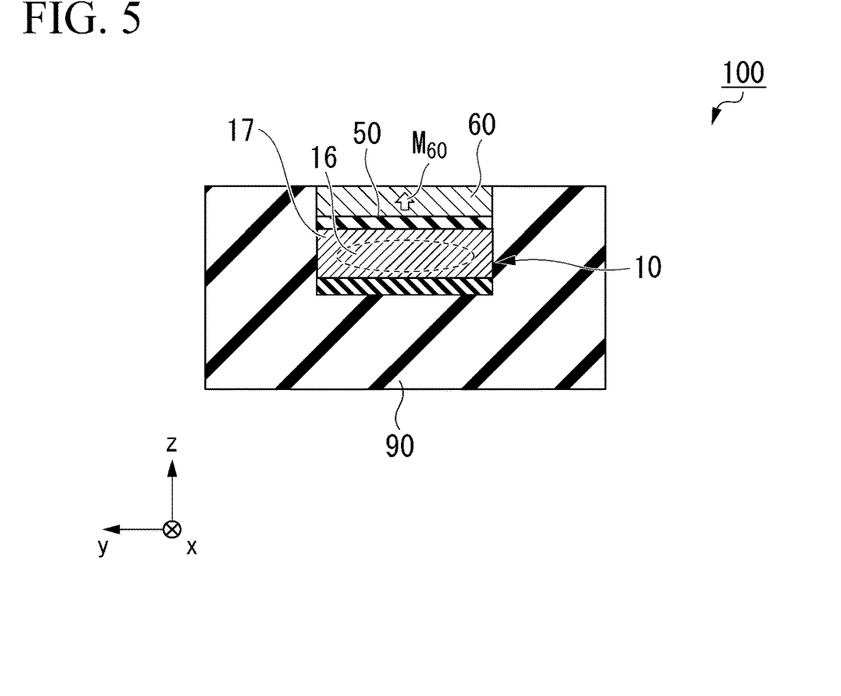
FIG. 5 is a cross-sectional view of the magnetic domain wall moving element according to the first embodiment along a line B-B.

FIG. 3 is a plan view of the magnetic domain wall moving element viewed from the z direction. FIG. 4 is a cross-sectional view of the magnetic domain wall moving element along the line A-A shown in FIG. 3. In FIG. 4, the magnetic domain wall moving element 100 is cut in the x-z plane passing through the center of the magnetic recording layer 10 in the y direction. FIG. 5 is a cross-sectional view of the magnetic domain wall moving element along the line B-B shown in FIG. 3. In FIG. 5, the magnetic domain wall moving element 100 is cut in a y-z plane passing through the center of the magnetic recording layer 10 in the x direction.

The magnetic domain wall moving element 100 has a magnetic recording layer 10, an intermediate layer 20, a first conductive layer 30, a second conductive layer 40, a non-magnetic layer 50, and a ferromagnetic layer 60. The magnetic domain wall moving element 100 is covered with an insulating layer 90. When data is written to the magnetic domain wall moving element 100, a writing current flows through the magnetic recording layer 10 between the first conductive layer 30 and the second conductive layer 40. When data is read from the magnetic domain wall moving element 100, a reading current flows between the first conductive layer 30 or the second conductive layer 40 and the ferromagnetic layer 60.

'Magnetic Recording Layer'

The magnetic recording layer 10 is a portion extending in the x direction and is a portion to which the writing current is applied. The magnetic recording layer 10 is, for example, a rectangle in which the x direction is a major axis and in the y direction is a minor axis in a plan view from the z direction. The magnetic recording layer 10 is connected to the first conductive layer 30 and the second conductive layer 40. The writing current flows along the magnetic recording layer 10 from the first conductive layer 30 toward the second conductive layer 40, or from the second conductive layer 40 toward the first conductive layer 30. The magnetic recording layer 10 is laminated on the intermediate layer 20, the first conductive layer 30, and the second conductive layer 40.

The magnetic recording layer 10 is a layer capable of magnetically recording information by a change in the internal magnetic state. In some cases, the magnetic recording layer 10 may be called a ferromagnetic layer or a magnetic domain wall moving layer.

The magnetic recording layer 10 has, for example, magnetization fixed regions 11 and 12 and a magnetic domain wall moving region 13. The magnetic domain wall moving region 13 is sandwiched between two magnetization fixed regions 11 and 12.

The magnetization fixed region 11 is a region that overlaps the first conductive layer 30 of the magnetic recording layer 10 when viewed from the z direction. The magnetization fixed region 12 is a region that overlaps the second conductive layer 40 of the magnetic recording layer 10 when viewed from the z direction. Magnetizations $M_{11}$ and $M_{12}$ of the magnetization fixed regions 11 and 12 are harder to reverse than magnetizations $M_{13A}$ and $M_{13B}$ of the magnetic domain wall moving region 13, and the magnetization does not reverse even when a threshold external force with which the magnetizations $M_{13A}$ and $M_{13B}$ of the magnetic domain wall moving region 13 reverse is applied. Therefore, it is said that the magnetizations $M_{11}$ and $M_{12}$ of the magnetization fixed regions 11 and 12 are fixed to the magnetizations $M_{13A}$ and $M_{13B}$ of the magnetic domain wall moving region 13. That is, in the present specification, the expression "magnetization is fixed" means that the magnetization does not reverse even if a writing current of a reverse current density with which the magnetization of the magnetic domain wall moving region 13 reverses is applied.

The magnetization $M_{11}$ of the magnetization fixed region 11 and the magnetization $M_{12}$ of the magnetization fixed region 12 are oriented in different directions. The magnetization $M_{11}$ of the magnetization fixed region 11 and the magnetization Mu of the magnetization fixed region 12 are oriented, for example, in opposite directions. The magnetization $M_{11}$ of the magnetization fixed region 11 is oriented, for example, in a +z direction, and the magnetization $M_{12}$ of the magnetization fixed region 12 is oriented, for example, in a −z direction.

The magnetic domain wall moving region 13 includes a first magnetic domain 13A and a second magnetic domain 13B. The first magnetic domain 13A is adjacent to the magnetization fixed region 11. The magnetization $M_{13A}$ of the first magnetic domain 13A is influenced by the magnetization $M_{11}$ of the magnetization fixed region 11, and is oriented, for example, in the same direction as the magnetization Mu of the magnetization fixed region 11. The second magnetic domain 13B is adjacent to the magnetization fixed region 12. The magnetization $M_{13B}$ of the second magnetic domain 13B is influenced by the magnetization $M_{12}$ of the magnetization fixed region 12, and is oriented, for example, in the same direction as the magnetization $M_{12}$ of the magnetization fixed region 12. Therefore, the magnetization $M_{13A}$ of the first magnetic domain 13A and the magnetization $M_{13B}$ of the second magnetic domain 13B are oriented in different directions. The magnetization $M_{13A}$ of the first magnetic domain 13A and the magnetization $M_{13B}$ of the second magnetic domain 13B are oriented, for example, in opposite directions.

A boundary between the first magnetic domain 13A and the second magnetic domain 13B is the magnetic domain wall 15. The magnetic domain wall 15 moves in the magnetic domain wall moving region 13. In principle, the magnetic domain wall 15 does not penetrate into the magnetization fixed regions 11 and 12.

When the ratio of the first magnetic domain 13A and the second magnetic domain 13B in the magnetic domain wall moving region 13 changes, the magnetic domain wall 15 moves. The magnetic domain wall 15 moves by making the writing current flow in the x direction of the magnetic domain wall moving region 13. For example, when the writing current (for example, a current pulse) in the +x direction is applied to the magnetic domain wall moving region 13, because electrons flow in the −x direction opposite to the current, the magnetic domain wall 15 moves in the −x direction. When the current flows from the first magnetic domain 13A to the second magnetic domain 13B, the spin-polarized electrons in the second magnetic domain 13B reverse the magnetization $M_{13A}$ of the first magnetic domain 13A. When the magnetization $M_{13A}$ of the first magnetic domain 13A reverses, the magnetic domain wall 15 moves in the −x direction.

The magnetic recording layer 10 is mainly made up of a magnetic material. The magnetic recording layer 10 preferably has at least one element selected from the group consisting of Fe, Co, Ni, Pt, Pd, Gd, Tb, Mn, Ge, and Ga. Materials used for the magnetic recording layer 10 include, for example, a laminated film of CoFe and Pt, a laminated film of CoFe and Pd, a laminated film of Co and Ni, a laminated film of Co and Pt, a laminated film of Co and Pd, a MnGa-based material, a GdCo-based material, a TbCo-based material, and the like. Because ferrimagnetic materials such as the MnGa-based material, the GdCo-based material, and the TbCo-based material have a small saturation magnetization, the threshold current required to move the magnetic domain wall 15 is small. Further, the laminated film of CoFe and Pt, the laminated film of CoFe and Pd, the laminated film of Co and Ni, the laminated film of Co and Pt, and the laminated film of Co and Pd have a large coercive force and the moving speed of the magnetic domain wall 15 becomes slow. Also, Materials used for the magnetic recording layer 10 include, for example, CoFeB, FeB and CoB. In the case of these materials are used in the magnetic recording layer 10, the magnetoresistance change ratio (MR ratio) of the magnetic domain wall moving element 100 is high.

The magnetic recording layer 10 contains a rare gas element. The rare gas element is He, Ne, Ar, Kr, Xe, Rn, or Og, and preferably Ar, Kr, or Xe.

The rare gas element is incorporated into, for example, the crystal structure of the crystal constituting the magnetic recording layer 10. The rare gas element is replaced with, for example, a part of the element in the crystal lattice of the magnetic recording layer 10. Further, for example, the rare gas element penetrates into the crystal lattice of the magnetic recording layer 10. The former is called a substitutional solid solution and the latter is called an interstitial solid solution. The rare gas elements have a larger atomic radius than other elements. Therefore, when the rare gas element is incorporated into the crystal structure, the crystal structure of the magnetic recording layer 10 is disturbed.

The crystal constituting the magnetic recording layer 10 includes a crystal lattice containing the rare gas element, and a crystal lattice not containing the rare gas element. Hereinafter, the crystal lattice containing the rare gas element is referred to as a first lattice, and the crystal lattice not containing the rare gas element is referred to as a second lattice.

For example, the lattice constant and anisotropy are different between the first lattice and the second lattice. Further, the connection of the electron clouds of the atoms constituting the first lattice and the connection of the electron clouds of the atoms constituting the second lattice are different. The magnetic domain wall 15 moves by the writing current. Since the connections of electron clouds are different, the ease of current flow differs between the first lattice and the second lattice. Therefore, the mobility of the magnetic domain wall 15 is non-uniform between the first lattice and the second lattice, and the magnetic domain wall 15 is trapped in the first lattice.

The first lattice and the second lattice are both dispersed in the magnetic recording layer 10. The dispersion of the first lattice and the second lattice can be observed, for example, with a Lorentz electron microscope (Lorentz TEM) in which a weak magnetic field is applied.

The average rare gas concentration of the magnetic recording layer 10 is, for example, 25 atm % or less, preferably 10 atm % or less. For example, when the first lattice and the second lattice are alternately arranged in the magnetic recording layer 10, the average rare gas concentration is 25 atm %. When the first lattice and the second lattice are alternately arranged in the magnetic recording layer 10, the largest number of trap sites are formed in the magnetic recording layer 10. Further, when the average rare gas concentration is 10 atm % or less, the magnetic properties of the magnetic recording layer 10 are unlikely to deteriorate.

The average rare gas concentration of the magnetic recording layer 10 is, for example, 0.14 atm % or more, preferably 0.28 atm % or less. When the rare gas concentration is in the aforementioned range, sufficient trap sites can be formed in the magnetic recording layer 10.

The average rare gas concentration is determined by, for example, energy dispersive X-ray analysis (EDX). The average rare gas concentration is an average value of the rare gas concentration at 10 different points in the x direction of the magnetic recording layer 10.

As shown in FIG. 5, the magnetic recording layer 10 is divided into a central region 16 and an outer peripheral region 17 on a surface intersecting the flow direction of the writing current. The central region 16 is located on the inner side of the magnetic recording layer 10 compared to the outer peripheral region 17. The concentration of the rare gas element in the central region 16 is higher than, for example, the concentration of the rare gas element in the outer peripheral region 17. The concentration of the rare gas element in the central region 16 may be lower than, for example, the concentration of the rare gas element in the outer peripheral region 17. The writing current flows more easily in the outer peripheral region 17 than in the central region 16 of the magnetic recording layer due to the skin effect. The magnetic domain wall 15 is moved by the spin transfer torque (STT) generated by the writing current. In the case of the concentration of the rare gas element in the central region 16 is higher than the concentration of the rare gas element in the outer peripheral region 17, the magnetic properties of the portion through which writing current flows are higher and the MR ratio of the domain wall movement device 100 is improved. Also, the variation in the amount of movement of the domain wall 15 with the application of a single write pulse becomes smaller. On the contrary, in the case of the concentration of the rare gas element in the central region 16 is lower than the concentration of the rare gas element in the outer peripheral region 17, there are many trap sites where the domain wall 15 is trapped at the portion where the write current flows, making it easier for the domain wall movement 100 to operate analogously. Also, the movement of the domain wall 15 is controlled by trap sites, which stabilizes the operation of the domain wall 15.

The magnetic recording layer 10 may contain any of the elements selected from the group consisting of Ta, Ru, Ir, Rh, W, Mo, Cu, Au, Ag, Cr, B, C, N, O, Mg, Al, Si, P, Ti, and V. When the magnetic recording layer 10 contains these elements, the basic skeleton of the crystal constituting the magnetic recording layer 10 is distorted, and the rare gas easily penetrates into the crystal lattice.

'Intermediate Layer'

The intermediate layer 20 is in contact with one surface of the magnetic recording layer 10. The intermediate layer 20 is between the magnetic recording layer 10 and the insulating layer 90. The intermediate layer 20 may be located between the magnetic recording layer 10 and the first conductive layer 30, the insulating layer 90, and the second conductive layer 40. Further, the magnetic domain wall moving element 100 may not have the intermediate layer 20. The intermediate layer 20 is sometimes referred to as a base layer.

The intermediate layer 20 is made of a non-magnetic material. The intermediate layer 20 defines, for example, the crystal structure of the magnetic recording layer 10. The crystal structure of the intermediate layer 20 enhances the crystallinity of the magnetic recording layer 10 and enhances the orientation of the magnetization of the magnetic recording layer 10. Further, for example, the crystal orientation of the magnetic recording layer 10 changes due to the crystal structure of the intermediate layer 20, and the magnetization of the magnetic recording layer 10 is oriented in the z direction. The crystal structure of the intermediate layer 20 is, for example, amorphous, a (001) oriented NaCl structure, a (002) oriented perovskite structure represented by the composition formula of $ABO_3$, a (001) oriented tetragonal structure or cubic structure, (111) oriented face-centered cubic structure, or a (0001) oriented hexagonal structure.

The intermediate layer 20 is a conductor or an insulator. The intermediate layer 20 is preferably a conductor. When the intermediate layer 20 is a conductor, the thickness of the intermediate layer 20 is preferably thinner than the thickness of the magnetic recording layer 10. The intermediate layer 20 contains, for example, Ta, Ru, Pt, Ir, Rh, W, Pd, Cu, Au, or Cr. The intermediate layer 20 is, for example, a laminated body of a Ta layer, a Ru layer, a Ta layer and a Ru layer.

'First Conductive Layer and Second Conductive Layer'

The first conductive layer 30 and the second conductive layer 40 are connected to the magnetic recording layer 10. The first conductive layer 30 and the second conductive layer 40 may be connected to the same surface of the magnetic recording layer 10 or may be connected to different surfaces. The second conductive layer 40 is separated from the first conductive layer 30 and connected to the magnetic recording layer 10. The first conductive layer 30 is connected to, for example, a first end portion of the magnetic recording layer 10, and the second conductive layer 40 is connected to, for example, a second end portion of the magnetic recording layer 10. The first conductive layer 30 and the second conductive layer 40 are, for example, connecting portions between the connection wiring Cw and the magnetic recording layer 10.

The first conductive layer 30 and the second conductive layer 40 shown in FIG. 4 contain a magnetic material. The magnetization $M_{30}$ of the first conductive layer 30 and the magnetization $M_{40}$ of the second conductive layer 40 are both oriented in one direction. The magnetization $M_{30}$ is oriented, for example, in the +z direction. The magnetization $M_{40}$ is oriented, for example, in the −z direction. The magnetization $M_{30}$ of the first conductive layer 30 and the magnetization $M_{11}$ of the magnetization fixed region 11 are oriented, for example, in the same direction. The magnetization $M_{40}$ of the second conductive layer 40 and the magnetization $M_{12}$ of the magnetization fixed region 12 are oriented, for example, in the same direction. The first conductive layer 30 fixes the magnetization $M_{11}$ of the magnetization fixed region 11. The second conductive layer 40 fixes the magnetization $M_{12}$ of the magnetization fixed region 12. The first conductive layer 30 is an example of the first magnetization fixed portion, and the second conductive layer 40 is an example of the second magnetization fixed portion. The magnetization fixed region 11 is an example of the first region, and the magnetization fixed region 12 is an example of the second region.

The first conductive layer 30 contains, for example, a metal selected from the group consisting of Cr, Mn, Co, Fe and Ni, an alloy containing at least one or more of these metals, and alloys containing these metals and at least one or more of the elements B, C, and N. The first conductive layer 30 is, for example, Co—Fe, Co—Fe—B, Ni—Fe, or the like. Further, the first conductive layer 30 may have a synthetic antiferromagnetic structure (SAF structure). The synthetic antiferromagnetic structure includes two magnetic layers sandwiching a non-magnetic layer. The magnetization of each of the two magnetic layers is fixed, and the directions of the fixed magnetization are opposite to each other. The material and composition of the second conductive layer 40 can be selected in the same manner as the first conductive layer.

At least one of the first conductive layer 30 and the second conductive layer 40 may contain a rare gas element. When the first conductive layer 30 and the second conductive layer 40 contain a rare gas, the lattice constant increases. When the lattice constant increases, a larger anisotropic magnetic field is generated, and the magnetizations $M_{11}$ and $M_{12}$ of the magnetization fixed regions 11 and 12 can be strongly fixed. The rare gas element contained in at least one of the first conductive layer 30 and the second conductive layer 40 is, for example, the same as the rare gas element contained in the magnetic recording layer 10.

The rare gas element concentration of at least one of the first conductive layer 30 and the second conductive layer 40 is lower than, for example, the rare gas element concentration of the magnetic recording layer 10. As described above, the first conductive layer 30 fixes the magnetization Mu of the magnetization fixed region 11, and the second conductive layer 40 fixes the magnetization $M_{12}$ of the magnetization fixed region 12. When the concentration of the rare gas element contained in each of the first conductive layer 30 and the second conductive layer 40 is low, deterioration of the magnetic properties of each of the first conductive layer 30 and the second conductive layer 40 can be suppressed. When the magnetic properties of the first conductive layer 30 and the second conductive layer 40 are stabilized, the fixation of the magnetizations $M_{11}$ and $M_{12}$ of the magnetization fixed regions 11 and 12 can be maintained. Although the ferromagnetic material can generate a large anisotropic magnetic field by containing the rare gas element, when the concentration of the rare gas element is too high, the magnetization is deactivated.

'Non-Magnetic Layer'

The non-magnetic layer 50 is located between the magnetic recording layer 10 and the ferromagnetic layer 60. The non-magnetic layer 50 is laminated on one surface of the magnetic recording layer 10.

The non-magnetic layer 50 is made of, for example, a non-magnetic insulator, a semiconductor or a metal. The non-magnetic insulator is, for example, $Al_2O_3$, $SiO_2$, MgO, $MgAl_2O_4$, and a material in which some of $Al_2O_3$, $SiO_2$, MgO, $MgAl_2O_4$ are replaced with Zn, Be, and the like. These materials have a large bandgap and are excellent in insulating properties. When the non-magnetic layer 50 is made of a non-magnetic insulator, the non-magnetic layer 50 is a tunnel barrier layer. The non-magnetic metals are, for example, Cu, Au, Ag and the like. The non-magnetic semiconductors are, for example, Si, Ge, $CuInSe_2$, $CuGaSe_2$, Cu(In, Ga) $Se_2$ and the like.

The thickness of the non-magnetic layer 50 is preferably 20 Å or more, and more preferably 25 Å or more. When the thickness of the non-magnetic layer 50 is large, the resistance area product (RA) of the magnetic domain wall moving element 100 increases. The resistance area product (RA) of the magnetic domain wall moving element 100 is preferably $1 \times 10^4$ $\Omega\mu m^2$ or more, and more preferably $5 \times 10^4$ $\Omega\mu m^2$ or more. The resistance area product (RA) of the magnetic domain wall moving element 100 is represented by the product of the element resistance of one magnetic domain wall moving element 100 and the element cross-sectional area (an area of the cut surface obtained by cutting the non-magnetic layer 50 on the x-y plane) of the magnetic domain wall moving element 100.

'Ferromagnetic Layer'

The ferromagnetic layer 60 is on the non-magnetic layer 50. The ferromagnetic layer 60 has a magnetization $M_{60}$ oriented in one direction. The magnetization $M_{60}$ of the ferromagnetic layer 60 is harder to reverse than the magnetizations $M_{13A}$ and $M_{13B}$ of the magnetic domain wall moving region 13 when a predetermined external force is applied. The predetermined external force is, for example, an external force applied to the magnetization by an external magnetic field or an external force applied to the magnetization by a spin polarization current. The ferromagnetic layer 60 is sometimes called a magnetization fixed layer or a magnetization reference layer.

The resistance value of the magnetic domain wall moving element 100 changes by a difference in the relative angle between the magnetization $M_{60}$ of the ferromagnetic layer 60 and the magnetizations $M_{13A}$ and $M_{13B}$ of the magnetic domain wall moving region 13. The magnetization $M_{13A}$ of the first magnetic domain 13A is, for example, in the same direction as (parallel to) the magnetization $M_{60}$ of the ferromagnetic layer 60, and the magnetization $M_{13B}$ of the second magnetic domain 13B is, for example, in the opposite direction (antiparallel) to the magnetization $M_{60}$ of the ferromagnetic layer 60. When the area of the first magnetic domain 13A in the portion overlapping the ferromagnetic layer 60 in the plan view from the z-direction increases, the resistance value of the magnetic domain wall moving element 100 decreases. In contrast, when the area of the second magnetic domain 13B in the portion overlapping the ferromagnetic layer 60 in the plan view from the z-direction increases, the resistance value of the magnetic domain wall moving element 100 increases.

The ferromagnetic layer 60 includes a ferromagnetic material. The ferromagnetic layer 60 contains, for example, a material that easily obtains a coherent tunnel effect with the magnetic recording layer 10. The ferromagnetic layer 60 contains, for example, a metal selected from the group consisting of Cr, Mn, Co, Fe and Ni, an alloy containing at least one kind or more of these metals, and an alloys containing these metals and at least one kinds or more of elements of B, C, and N. The ferromagnetic layer 60 is, for example, Co—Fe, Co—Fe—B, and Ni—Fe.

The ferromagnetic layer 60 may be, for example, a Heusler alloy. The Heusler alloy is a half metal, and has a high spin polarizability. The Heusler alloy is an intermetallic compound having a chemical composition of XYZ or $X_2YZ$, where X is a transition metal element or noble metal element of Co, Fe, Ni or Cu group on the periodic table, and Y is a transition metal of Mn, V, Cr or Ti group or an elemental species of X, and Z is a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like.

The ferromagnetic layer 60 may contain a rare gas element. Similar to the first conductive layer 30 and the second conductive layer 40, when the ferromagnetic layer 60 contains a rare gas, the lattice constant increases. When the lattice constant increases, a larger anisotropic magnetic field is generated. The rare gas element contained in the ferromagnetic layer 60 is, for example, the same as the rare gas element contained in the magnetic recording layer 10.

The rare gas element concentration of the ferromagnetic layer 60 is lower than, for example, the rare gas element concentration of the magnetic recording layer 10. When the concentration of the rare gas element contained in the ferromagnetic layer 60 is low, it is possible to suppress deterioration of the magnetic properties of the ferromagnetic layer 60. The magnetic domain wall moving element 100 records data by a difference in relative angles between the magnetization $M_{60}$ of the ferromagnetic layer 60 and the magnetizations $M_{13A}$ and $M_{13B}$ of the magnetic domain wall moving region 13. When the magnetic properties of the ferromagnetic layer 60 are stabilized, the MR ratio of the magnetic domain wall moving element 100 is improved.

A film thickness of the ferromagnetic layer 60 is preferably 1.5 nm or less, more preferably 1.0 nm or less, when the easy axis of magnetization of the ferromagnetic layer 60 is in the z-direction (a vertical magnetization film). When the film thickness of the ferromagnetic layer 60 is reduced, vertical magnetic anisotropy (interfacial perpendicular magnetic anisotropy) is added to the ferromagnetic layer 60 at the interface between the ferromagnetic layer 60 and another layer (the non-magnetic layer 50). Therefore, the magnetization of the ferromagnetic layer 60 is easily oriented in the z-direction.

When the easy axis of magnetization of the ferromagnetic layer 60 is in the z-direction (the vertical magnetization film), the ferromagnetic layer 60 is preferably a laminated body of a ferromagnetic material selected from the group consisting of Co, Fe, and Ni, and a non-magnetic material selected from the group consisting of Pt, Pd, Ru and Rh, and it is more preferable to insert an intermediate layer selected from the group consisting of Ir and Ru at any position of the laminated body. Vertical magnetic anisotropy can be added when laminating the ferromagnetic material and the non-magnetic material, and the magnetization of the ferromagnetic layer 60 can be easily oriented in the z-direction by inserting an intermediate layer.

An antiferromagnetic layer may be provided on the surface of the ferromagnetic layer 60 opposite to the non-magnetic layer 50 via a spacer layer. The ferromagnetic layer 60, the spacer layer, and the antiferromagnetic layer have a synthetic antiferromagnetic structure (an SAF structure). The synthetic antiferromagnetic structure includes two magnetic layers sandwiching a non-magnetic layer. By antiferromagnetic coupling between the ferromagnetic layer 60 and the antiferromagnetic layer, the coercive force of the ferromagnetic layer 60 increases as compared with a case having no antiferromagnetic layer. The antiferromagnetic layer is, for example, IrMn, PtMn, or the like. The spacer layer contains, for example, at least one selected from the group consisting of Ru, Ir, and Rh.

The direction of magnetization of each layer of the magnetic domain wall moving element 100 can be checked, for example, by measuring the magnetization curve. The magnetization curve can be measured using, for example, a Magneto Optical Kerr Effect (MOKE). The measurement by MOKE is a measurement method performed by making linearly polarized light incident on an object to be measured and using a magneto-optical effect (magneto-optical Kerr effect) in which rotation in the polarization direction occurs.

Next, a method of manufacturing the magnetic recording array 200 will be described. The magnetic recording array 200 is formed by a laminating step of each layer and a processing step of processing a part of each layer into a predetermined shape. A sputtering method, a chemical vapor deposition (CVD) method, an electron beam vapor deposition method (EB vapor deposition method), an atomic laser deposit method, or the like can be used for the lamination of each layer. The processing of each layer can be performed using photolithography or the like.

First, impurities are doped at a predetermined position on the substrate Sub to form a source region S and a drain region D. Next, a gate insulating film GI and a gate electrode G are formed between the source region S and the drain region D. The source region S, the drain region D, the gate insulating film GI, and the gate electrode G serve as a transistor Tr.

Next, the insulating layer 90 is formed to cover the transistor Tr. Further, the connection wiring Cw is formed by forming an opening in the insulating layer 90 and filling the opening with a conductor. A first wiring Wp and a second wiring Cm are formed by laminating the insulating layer 90 to a predetermined thickness, forming a groove in the insulating layer 90, and filling the groove with a conductor.

The first conductive layer 30 and the second conductive layer 40 can be formed by, for example, laminating a ferromagnetic layer on one surface of the insulating layer 90 and the connection wiring Cw, and removing portions other than the portions that become the first conductive layer 30 and the second conductive layer 40. When the ferromagnetic layers are laminated under a rare gas atmosphere, the first conductive layer 30 and the second conductive layer 40 contain rare gas elements. The gas pressure of the rare gas at this time is preferably lower than the gas pressure when the magnetic recording layer 10 is laminated. Further, the applied voltage to be applied to the target of sputtering is also preferably lower than that when the magnetic recording layer 10 is laminated. The removed portion is filled with, for example, the insulating layer 90.

Next, the intermediate layer 20 is laminated on the first conductive layer 30, the second conductive layer 40, and the insulating layer 90. A resist is formed on a part of the intermediate layer 20. The resist is formed to straddle a part of the magnetization fixed region 11, the magnetic domain wall moving region 13, and the magnetization fixed region 12. Next, the intermediate layer 20 is processed via a resist. For example, the intermediate layer 20 and the resist are irradiated with an ion beam. The portion of the intermediate layer 20 that is not coated with the resist is removed.

Next, the magnetic recording layer 10, the non-magnetic layer 50, and the ferromagnetic layer 60 are laminated sequentially. Lamination of these layers is performed under a rare gas atmosphere. When laminating the magnetic recording layer 10 and the ferromagnetic layer 60, for example, the film is formed by repeating the film formation and etching of the magnetic film. The magnetic film is formed in units of several Å under a rare gas atmosphere. Etching of the magnetic film is performed by reverse sputtering under the rare gas atmosphere. By repeating the film formation and etching of the magnetic film, more rare gas elements are incorporated into the magnetic recording layer 10 and the ferromagnetic layer 60. Further, by adjusting a balance between the film thickness and the film thickness to be etched, it is possible to adjust the contents of the rare gas element in the magnetic recording layer 10 and the ferromagnetic layer 60. Further, the gas pressure of the rare gas when forming the ferromagnetic layer 60 is preferably lower than the gas pressure when laminating the magnetic recording layer 10. Further, it is preferable that the applied voltage applied to the sputtering target when forming the ferromagnetic layer 60 be also lower than that when the magnetic recording layer 10 is laminated. After that, the non-magnetic layer 50 and the ferromagnetic layer 60 are processed into a predetermined shape to obtain the magnetic domain wall moving element 100.

According to the magnetic domain wall moving element 100 according to the first embodiment, since the crystal lattice containing the rare gas serves as a trap site, the number of gradations of the magnetic domain wall moving element 100 can be further increased. Further, since the crystal lattice is smaller than the crystal grain boundaries, even if the magnetic domain wall moving element 100 is made finer, it can be applied as a trap site.

Although an example of the magnetic recording array 200 and the magnetic domain wall moving element 100 according to the first embodiment has been described in detail, various modifications and changes can be made to the magnetic recording array 200 and the magnetic domain wall moving element 100 according to the first embodiment within the scope of the gist of the present invention.

For example, in the magnetic domain wall moving element 100, although the first conductive layer 30 and the second conductive layer 40 both contain a ferromagnetic material, only one of them may contain a ferromagnetic material. This is because the magnetic domain wall 15 can be properly operated, when fixing the magnetization of one end portion of the magnetic recording layer 10.

Further, in the aforementioned magnetic domain wall moving element 100, a conductive layer (the first conductive layer 30 and the second conductive layer 40) containing a ferromagnetic material was used as a magnetization fixed portion. However, the magnetization fixed portion is not limited to the conductive layer containing a ferromagnetic material.

For example, a wiring which extends in a direction intersecting the magnetic recording layer 10 and is separated from the magnetic recording layer 10 may be used as a magnetization fixed portion. The magnetization of the magnetization fixed regions 11 and 12 of the magnetic recording layer 10 is fixed by an external magnetic field generated around the wiring when an electric current flows.

Further, for example, the SOT wiring which extends in the direction intersecting the magnetic recording layer 10 and is in contact with the magnetic recording layer 10 may be used as the magnetization fixed portion. The magnetization of the magnetization fixed regions 11 and 12 of the magnetic recording layer 10 is fixed by the spin injected into the magnetic recording layer 10 from the SOT wiring when an electric current flows. Spin is injected into the magnetic recording layer 10 by the spin Hall effect, and gives spin-orbit torque to the magnetization of the magnetic recording layer 10.

Figure 6:
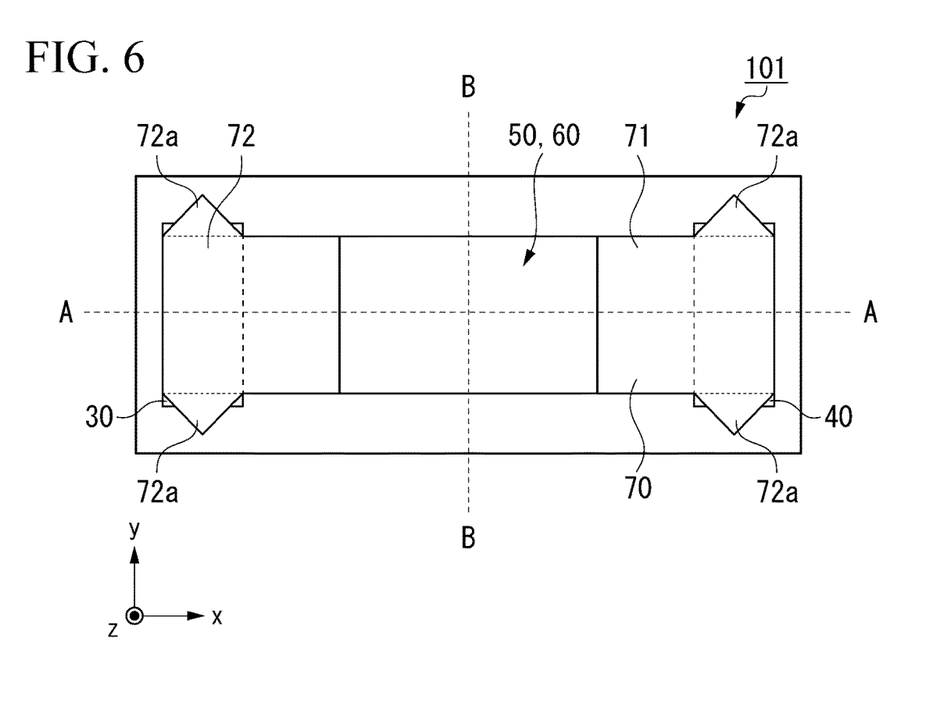
FIG. 6 is a cross-sectional view of a magnetic domain wall moving element according to a first modified example.

Further, for example, the magnetization fixed portion may be provided by changing the width of the magnetic recording layer 10 in the y-direction. FIG. 6 is a modified example of the magnetic domain wall moving element according to the first embodiment. The shape of a magnetic recording layer 70 of the magnetic domain wall moving element 101 is different from that of the aforementioned magnetic recording layer 10.

The magnetic recording layer 70 has a magnetic domain wall moving region 71 and a magnetization fixed region 72. The width of the magnetization fixed region 72 in the y-direction is wider than the width of the magnetic domain wall moving region 71 in the y-direction. The magnetization fixed region 72 has a protruding region 72a protruding from a plane parallel to the end surface of the magnetic domain wall moving region 71 in the y-direction. The magnetic domain wall moving region 71 and the magnetization fixed region 72 differ in the ease of current flow. The magnetic recording layer 70 controls the operating range of the magnetic domain wall by the width in the y-direction at the position in the x-direction. The magnetic domain wall does not penetrate the magnetization fixed region 72. The magnetization of the magnetization fixed region 72 is fixed in one direction due to the presence of the protruding region 72a. That is, the protruding region 72a is an example of the magnetization fixed portion.

Second Embodiment

Figure 7:
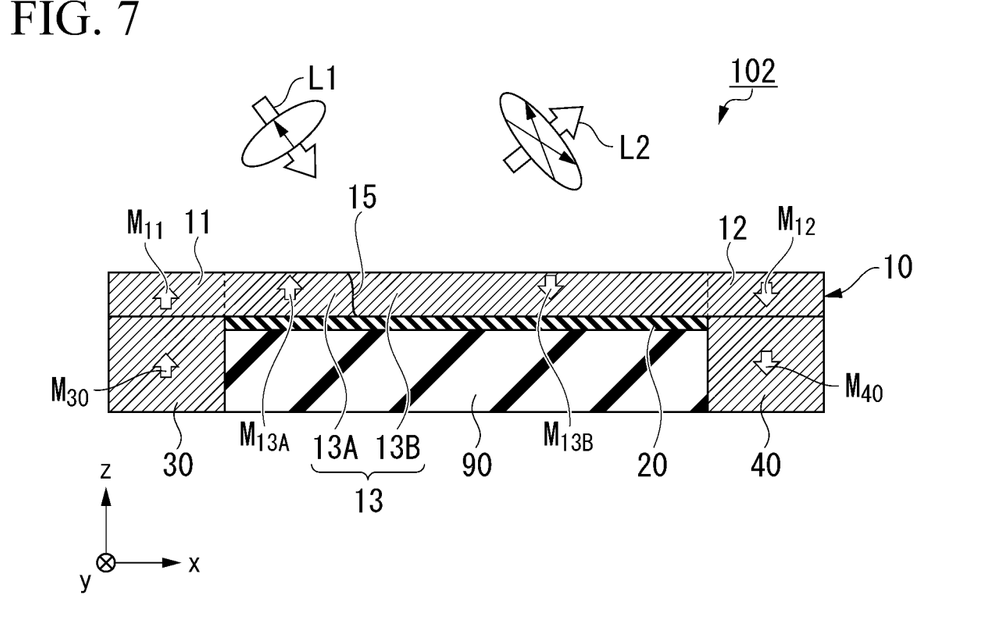
FIG. 7 is a cross-sectional view of a magnetic domain wall moving element according to a second embodiment.

FIG. 7 is a cross-sectional view of a magnetic domain wall moving element 102 according to the second embodiment in the y-z plane. The magnetic domain wall moving element 102 is different from the magnetic domain wall moving element 100 in that it does not have the non-magnetic layer 50 and the ferromagnetic layer 60. The same configurations as those of the magnetic domain wall moving element 100 in the magnetic domain wall moving element 102 are designated by the same reference numerals, and the description thereof will not be provided.

The magnetic domain wall moving element 102 can be used as an optical modulator. A light L1 is incident on the magnetic recording layer 10, and a light L2 reflected by the magnetic recording layer 10 is evaluated. The deflection state of the light L2 reflected at the portion where the orientation direction of magnetization is different due to the magneto-optical Kerr effect is different. The magnetic domain wall moving element 102 can be used as an image display device utilizing the difference in the deflection state of the light L2.

Also in the magnetic domain wall moving element 102 according to the second embodiment, the magnetic recording layer 10 contains a rare gas element. Therefore, the magnetic domain wall moving element 102 according to the second embodiment also has the same effect as the magnetic domain wall moving element 100.

The preferred embodiment of the present invention has been described in detail above. The characteristic configurations in the embodiments and the modified example may be combined.

REFERENCE SIGNS LIST 10, 70 Magnetic recording layer
11, 12, 72 Magnetization fixed region
13, 71 Magnetic domain wall moving region
13A First magnetic domain
13B Second magnetic domain
15 Magnetic domain wall
16 Central region
17 Outer peripheral region
20 Intermediate layer
30 First conductive layer
40 Second conductive layer
50 Non-magnetic layer
60 Ferromagnetic layer
72a Protruding region
90 Insulation layer
100, 101 Magnetic domain wall moving element
110 First switching element
120 Second switching element
130 Third switching element
200 Magnetic recording array

What is claimed is:

1. A magnetic recording layer which has a magnetic domain wall inside and contains a rare gas element,
   wherein a central region of the magnetic recording layer has a lower concentration of the rare gas element than an outer peripheral region of the magnetic recording layer on a cut surface intersecting a first direction in which the magnetic recording layer extends.

2. The magnetic recording layer according to claim 1, wherein an average rare gas concentration is 25 atm % or less.

3. The magnetic recording layer according to claim 1, wherein an average rare gas concentration is 0.14 atm % or more.

4. A magnetic domain wall moving element comprising:
   the magnetic recording layer according to claim 1;
   a first magnetization fixed portion which is configured to fix a magnetization of a first region of the magnetic recording layer; and
   a second magnetization fixed portion which is configured to fix the magnetization of a second region sandwiching the magnetic domain wall of the magnetic recording layer with the first region.

5. The magnetic domain wall moving element according to claim 4, wherein at least one of the first magnetization fixed portion and the second magnetization fixed portion is a conductive layer connected to the magnetic recording layer and containing a ferromagnetic material.

6. The magnetic domain wall moving element according to claim 4, further comprising:
   a non-magnetic layer and a ferromagnetic layer laminated on the magnetic recording layer,
   the non-magnetic layer being located between the ferromagnetic layer and the magnetic recording layer.

7. A magnetic recording array having a plurality of magnetic domain wall moving elements according to claim 4.

8. A magnetic recording layer which has a magnetic domain wall inside and contains a rare gas element comprising:

a first lattice containing the rare gas element in a crystal lattice, and a second lattice containing no rare gas element in the crystal lattice, the first lattice being dispersed inside.

9. The magnetic recording layer according to claim 8, wherein a central region of the magnetic recording layer has a higher concentration of the rare gas element than an outer peripheral region of the magnetic recording layer on a cut surface intersecting a first direction in which the magnetic recording layer extends.

10. The magnetic recording layer according to claim 8, wherein a central region of the magnetic recording layer has a lower concentration of the rare gas element than an outer peripheral region of the magnetic recording layer on a cut surface intersecting a first direction in which the magnetic recording layer extends.

11. The magnetic recording layer according to claim 8, wherein an average rare gas concentration is 25 atm % or less.

12. The magnetic recording layer according to claim 8, wherein an average rare gas concentration is 0.14 atm % or more.

13. A magnetic domain wall moving element comprising:
the magnetic recording layer according to claim 6;
a first magnetization fixed portion which is configured to fix a magnetization of a first region of the magnetic recording layer; and
a second magnetization fixed portion which is configured to fix the magnetization of a second region sandwiching the magnetic domain wall of the magnetic recording layer with the first region.

14. A magnetic domain wall moving element comprising:
the magnetic recording layer which has a magnetic domain wall inside and contains a rare gas element;
a first magnetization fixed portion which is configured to fix a magnetization of a first region of the magnetic recording layer; and
a second magnetization fixed portion which is configured to fix the magnetization of a second region sandwiching the magnetic domain wall of the magnetic recording layer with the first region,
wherein at least one of the first magnetization fixed portion and the second magnetization fixed portion is a conductive layer connected to the magnetic recording layer and containing a ferromagnetic material,
wherein the conductive layer has a rare gas element, and
a rare gas element concentration of the magnetic recording layer is higher than a rare gas element concentration of the conductive layer.

15. A magnetic domain wall moving element comprising:
the magnetic recording layer which has a magnetic domain wall inside and contains a rare gas element;
a first magnetization fixed portion which is configured to fix a magnetization of a first region of the magnetic recording layer;
a second magnetization fixed portion which is configured to fix the magnetization of a second region sandwiching the magnetic domain wall of the magnetic recording layer with the first region; and
a non-magnetic layer and a ferromagnetic layer laminated on the magnetic recording layer,
wherein the non-magnetic layer being located between the ferromagnetic layer and the magnetic recording layer,
wherein the ferromagnetic layer has a rare gas element, and
a rare gas element concentration of the magnetic recording layer is higher than a rare gas element concentration of the ferromagnetic layer.

* * * * *